US009111675B1

(12) United States Patent
Kireev

(10) Patent No.: US 9,111,675 B1
(45) Date of Patent: Aug. 18, 2015

(54) STACKED INDUCTOR STRUCTURE

(75) Inventor: Vassili Kireev, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 12 days.

(21) Appl. No.: 13/347,538

(22) Filed: Jan. 10, 2012

Related U.S. Application Data

(63) Continuation-in-part of application No. 12/755,781, filed on Apr. 7, 2010, now Pat. No. 8,143,987.

(51) Int. Cl.
*H01F 5/00* (2006.01)
*H01F 27/28* (2006.01)
*H01F 17/00* (2006.01)

(52) U.S. Cl.
CPC ........ *H01F 17/0013* (2013.01); *H01F 17/0006* (2013.01)

(58) Field of Classification Search
USPC ................................................. 336/200, 232
See application file for complete search history.

(56) References Cited

U.S. PATENT DOCUMENTS

| | | | |
|---|---|---|---|
| 4,990,802 A | 2/1991 | Smooha | |
| 5,017,902 A | 5/1991 | Yerman et al. | |
| 5,610,433 A * | 3/1997 | Merrill et al. | 257/531 |
| 5,831,331 A * | 11/1998 | Lee | 257/659 |
| 7,046,114 B2 | 5/2006 | Sakata | |
| 7,265,433 B2 | 9/2007 | Pillai et al. | |
| 2004/0155675 A1 | 8/2004 | Zerbe et al. | |
| 2005/0052272 A1 | 3/2005 | Tiebout | |
| 2005/0190035 A1 | 9/2005 | Wang | |
| 2005/0258508 A1 | 11/2005 | Sakamoto | |
| 2006/0181385 A1 | 8/2006 | Hurley | |
| 2007/0247269 A1 | 10/2007 | Papananos | |
| 2008/0169895 A1 | 7/2008 | Lee | |
| 2009/0108978 A1 | 4/2009 | Loke et al. | |
| 2009/0115562 A1 | 5/2009 | Lee et al. | |
| 2010/0128908 A1 | 5/2010 | Park | |
| 2010/0157494 A1 | 6/2010 | Kim et al. | |
| 2011/0105072 A1 | 5/2011 | Bhagat et al. | |
| 2011/0248811 A1 | 10/2011 | Kireev | |
| 2014/0084862 A1 | 3/2014 | Kawaguchi et al. | |

FOREIGN PATENT DOCUMENTS

| | | |
|---|---|---|
| DE | 102006039733 A1 | 3/2007 |
| EP | 0 997 945 A1 | 5/2000 |
| TW | 200839805 A | 10/2008 |

(Continued)

OTHER PUBLICATIONS

U.S. Appl. No. 13/828,943, filed Mar. 14, 2013, Kireev.

(Continued)

*Primary Examiner* — Tsz Chan
(74) *Attorney, Agent, or Firm* — John J. King

(57) ABSTRACT

An inductor implemented in an integrated circuit is described. The inductor comprises a plurality of loops of the inductor in at least a first metal layer and a second metal layer of a plurality of metal layers; and a plurality of vias connecting ends of loops of the plurality of loops in different metal layers; wherein each loop of the first metal layer which is connected to a corresponding loop of the second metal layer overlies the corresponding loop of the second metal layer. A method of implementing an inductor in an integrated circuit is also described.

19 Claims, 4 Drawing Sheets

(56) References Cited

FOREIGN PATENT DOCUMENTS

WO      WO 96/28832 A1      9/1996
WO      WO 2008/014506 A2      1/2008

OTHER PUBLICATIONS

Allam, Mohammed W., "Dynamic Current Mode Logic (DyCML): A New Low-Power High-Performance Logic Style," *IEEE Journal of Solid-State Circuits*, Mar. 2001, pp. 550-558, vol. 36, No. 3, IEEE, Piscataway, New Jersey, USA.

U.S. Appl. No. 12/755,781, filed Apr. 7, 2010, Kireev.

U.S. Appl. No. 13/347,518, filed Jan. 10, 2012, Kireev et al.

Galal, Sherif, "Broadband ESD Protection Circuits in CMOS Technology" *IEEE Journal of Solid-State Circuits* Dec. 2003, pp. 2334-2340, vol. 38, No. 12, IEEE, Piscataway, New Jersey, USA.

Kossel, Marcel et al., "A T-Coil-Enhanced 8.5 GB/s High-Swing SST Transmitter in 65 nm Bulk CMOS with <-16 dB Return Loss Over 10 GHz Bandwidth," *IEEE Journal of Solid-State Circuits*, Dec. 2008, pp. 2905-2920, vol. 43, No. 12, IEEE, Piscataway, New Jersey, USA.

Linten, D. et al., "A 4.5 kV HBM, 300 V CDM, 1.2 kV HMM ESD Protected DC-to-16.1 GHz Wideband LNA in 90 nm CMOS," *Proc. of the 2009 EOS/ESD Symposium*, pp. 5A.6-1 to 5A.6-6, ESD Association, Rome, New York, USA.

Pillai, Edward, et al. "Novel T-Coil Structure and Implementation in a 6.4-GB/s CMOS Receiver to Meet Return Loss Specifications," *2007 Electronic Components and Technology Conference*, pp. 147-153, IEEE, Piscataway, New Jersey, USA.

Zolfaghari, Alireza et al., "Stacked Inductors and Transformers in CMOS Technology" *IEEE Journal of Solid-State Circuits*, Apr. 2001, pp. 620-628, vol. 36, No. 4, IEEE, Piscataway, New Jersey, USA.

Han, Ki Jin et al., "Eye-Pattern Design for High-Speed Differential Links Using Extended Passive Equalization," *IEEE Transactions on Advanced Packaging*, May 2008, pp. 246-257, vol. 31, No. 2, IEEE, Piscataway, New Jersey, USA.

\* cited by examiner

STACKED INDUCTOR STRUCTURE

CROSS-REFERENCE TO RELATED APPLICATION

This application is a continuation-in-part of co-pending, commonly assigned application Ser. No. 12/755,781, by Vassili Kireev, entitled "Stacked Dual Inductor Structure" and filed Apr. 7, 2010, which is incorporated herein by reference in its entirety.

FIELD OF THE INVENTION

The present invention relates generally to integrated circuits, and in particular, to a driver circuit and a method of generating an output signal.

BACKGROUND

Driver circuits are used in an integrated circuit to transmit signals. Driver circuits are commonly used to generate output signals at output ports of the integrated circuit. Because an output driver is coupled to a circuit such as a transmission line external to the integrated circuit, it is important that the circuit is matched to enable the signal to be properly transferred from the output port. In conventional series source termination (SST) driver configurations, a three terminal configuration, or T-coil, transformer has two ports connected to the driver output and the output port, and center tap port connected to an electro-static discharge (ESD) protection device. Accordingly, the T-coil is designed for the best return loss in the integrated circuit, and enables the transimpedance seen from the pads to be close to 50 Ohms at maximum bandwidth.

However, optimization of return loss does not necessarily optimize transient characteristics of the driver, such as rise and fall time, overshot, and settling time. Moreover, a three terminal transformer configuration generates a set of design parameters which need to be tweaked for fine tuning. These parameters include the inductances of two t-coil inductors L1 and L2, mutual coupling k between these inductors, resistances R1 and R2 of the inductors, and a bridge capacitance between two ports. Managing all these parameters together with port parasitic capacitance adds complexity to the design, and may not be critical for TX driver performance.

SUMMARY

An inductor implemented in an integrated circuit is described. The inductor comprises a plurality of loops of the inductor in at least a first metal layer and a second metal layer of a plurality of metal layers; and a plurality of vias connecting ends of loops of the plurality of loops in different metal layers; wherein each loop of the first metal layer which is connected to a corresponding loop of the second metal layer overlies the corresponding loop of the second metal layer.

The inductor may comprise a first plurality of loops in a first corresponding plurality of metal layers, wherein the first plurality of loops is vertically aligned. The inductor may also comprise a second plurality of loops in a second corresponding plurality of metal layers, wherein the second plurality of loops is vertically aligned. The first plurality of loops may have a first size and the second plurality of loops may have a second size which is different from the first size. A first terminal of the inductor may be on a first end of a first loop on a first metal layer and a second terminal of the inductor may be on the first metal layer. A second end of the first loop may be coupled to a second loop of a second metal layer by a via between the first metal layer and the second metal layer, where the second metal layer is adjacent to the first metal layer.

According to an alternate embodiment, an inductor implemented in an integrated circuit comprises a first plurality of loops of the inductor formed on a first corresponding plurality of metal layers, the first plurality of loops coupled by first vias between the first corresponding plurality of metal layers, each loop of the first plurality of loops having a first size; and a second plurality of loops of the inductor formed on a second corresponding plurality of metal layers, the second plurality of loops coupled by second vias between the second corresponding plurality of metal layers, each loop of the second plurality of loops having a second size different from the first size; wherein the first plurality of loops is coupled to the second plurality of loops.

The loops of the first plurality of loops may be vertically aligned, and the loops of the second plurality of loops may be vertically aligned. The loops of the first plurality of loops may be of the same shape and have approximately equal first dimensions, and the loops of the second plurality of loops may be of the same shape and have approximately equal second dimensions which are different from the first dimensions. A first terminal of the inductor may be on a first end of a first loop on a first metal layer and a second terminal of the inductor may be on the first metal layer. A second end of the first loop on the first metal layer may be coupled to an end of a second loop on a second metal layer. The plurality of metal layers may extend from a first metal layer to a last metal layer, where a first terminal and a second terminal of the inductor are on the first metal layer. The first plurality of loops and the second plurality of loops may form a single coil between a first terminal and a second terminal.

A method of implementing an inductor in an integrated circuit is also described. The method comprises providing a first plurality of loops of a first size in a plurality of metal layers of the integrated circuit; coupling, for each loop of the first plurality of loops, at least one end of the loop to an end of a loop of the first plurality of loops in an adjacent metal layer; providing a second plurality of loops of a second size in the plurality of metal layers of the integrated circuit; coupling, for each loop of the second plurality of loops, at least one end of the loop to an end of a loop of the second plurality of loops in an adjacent metal layer; and coupling an end of a last loop of the first plurality of loops to an end of a first loop of the second plurality of loops.

Providing a first plurality of loops may comprise providing an outer coil and providing a second plurality of loops may comprise providing an inner coil. Each of a first terminal and a second terminal of the inductor may be on a first metal layer. Coupling an end of a last loop of the first plurality of loops to an end of a first loop of the second plurality of loops may comprise coupling the outer coil to the inner coil. Providing a first plurality of loops may comprise providing first loops in the plurality of metal layers which are aligned, and providing a second plurality of loops may comprise providing second loops in the plurality of metal layers which are aligned. Coupling an end of a last loop of the first plurality of loops to an end of a first loop of the second plurality of loops may comprise coupling the first plurality of loops and the second plurality of loops form a single coil between a first terminal and a second terminal of the inductor.

DETAILED DESCRIPTION

Figure 1:
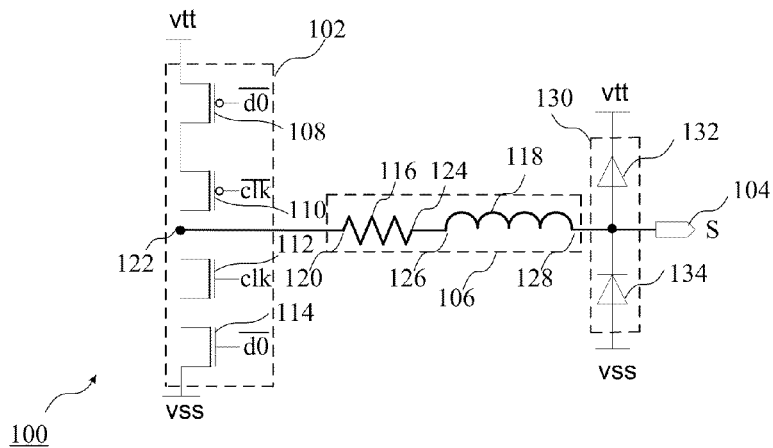
FIG. 1 is a block diagram of an output driver according to an embodiment.

Turning first to FIG. 1, a block diagram of an output driver 100 is shown. In particular, a driver 102 is configured to drive an output node 104, generating an output signal S, by way of an inductor circuit 106. The driver 102 comprises a series of transistors 108-114 configured as shown to generate the signal to be output as output signal S. In particular, an inverted data (d0 bar) signal is coupled to the gate of the p-channel transistor 108 of the driver circuit 102, and an inverted clock (clk bar) signal is coupled to the gate of a p-channel transistor 110. The clock signal is also coupled to the gate of an n-channel transistor 112 and the inverted data signal is coupled to the gate of an n-channel transistor 114.

The inductor circuit 106 comprises a resistor 116 and an inductor 118. A first terminal 120 of the resistor 116 is coupled to a signal node 122 at the drains of the transistors 110 and 112. The signal to be generated as output signal S is generated at the signal node 122. A second terminal 124 of the resistor 120 is coupled to a first terminal 126 of the inductor 118. A second terminal 128 of the inductor 118 is coupled to the output node 104. An electro-static discharge circuit 130 is also coupled to the output node 104. The electro-static discharge circuit may comprise a first diode 132 coupled between the output terminal 104 and a first reference potential, designated here as vtt. A second diode 134 is coupled between the output node 104 and a second reference potential, designated here as vss. Alternatively, ESD protection could be implemented on one reference potential, and be fabricated based upon other devices, such as a silicon controlled rectifier (SCR), clamps, or other elements.

The circuit of FIG. 1 provides an inductive peaking network for a voltage mode SST driver, enabling improved performance and a small inductor footprint. The circuit of FIG. 1 significantly simplifies inductor design, layout optimization and tuning/debugging. By using a two port inductor circuit of FIG. 1, the number of design parameters, the effect of layout patristic extraction uncertainty, and the footprint of an inductor circuit is reduced. The circuit of FIG. 1 improves rise/fall time, for example, from 38 ps to 25 ps, which allows the SST driver to operate up to 25-30 Gbt/s.

Figure 2:
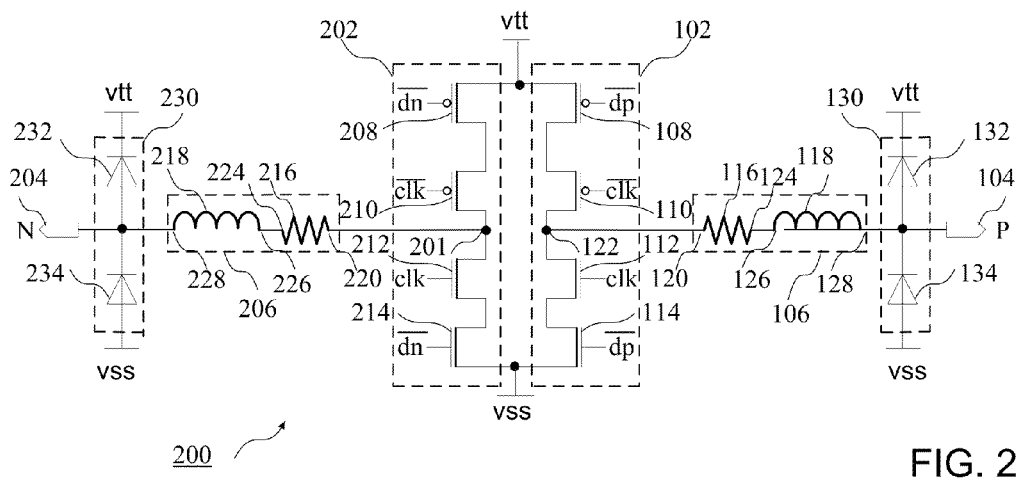
FIG. 2 is a block diagram of a differential output driver according to an embodiment.

According to the embodiment of FIG. 2, a differential output signal could be generated using a differential output driver circuit 200 as shown. That is, in addition to receiving an input of a differential input signal at the signal node 122 to generate an output signal P, a differential input signal, having an opposite polarity as the differential input signal coupled to the input 122, is coupled to an input 201 of a driver circuit 202. The driver 202 is configured to drive an output node 204, generating an output signal N, by way of an inductor circuit 206. According to the embodiment of FIG. 2, the circuit in FIG. 1 receives the differential input signal dp and generates an output signal P, while a second circuit which is substantially identical to the circuit of FIG. 1 receives the differential input dn, and generates and output N.

In particular, the driver 202 comprises a series of transistors 208-214 configured as shown. An inverted data (dn bar) signal is coupled to the gate of the p-channel transistor 208 of the driver circuit 202 and an inverted clock (clock bar) signal is coupled to the p-channel transistor 210, while the clock signal is coupled to the n-channel transistor 212 and the inverted data signal is coupled to the n-channel transistor 214. The inductor circuit 206 comprises a resistor 216 and an inductor 218. A first terminal 220 of the resistor 216 is coupled to a node 201 at the drains of the transistors 210 and 212. A second terminal 224 of the resistor 220 is coupled to a first terminal 226 of the inductor 218. A second terminal 228 is coupled to the output terminal 204. An electro-static discharge circuit 230 comprises a first diode 232 coupled between the output terminal 204 and the first reference potential vtt. A second diode 234 is coupled between the output node 204 and the second reference potential vss.

Figure 3:
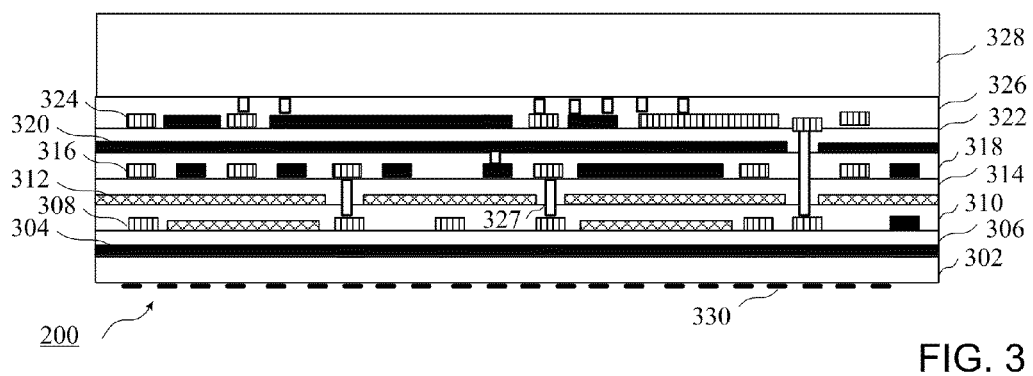
FIG. 3 is a cross-sectional view of an integrated circuit having metal layers according to an embodiment.

Turning now to FIG. 3, a cross-sectional view of an integrated circuit is shown. As shown in FIG. 3, metal layers having conductive traces for different signal types are provided. By way of example, a ground trace is indicated in solid black, a signal trace is indicated by cross-hatched lines, and a power voltage trace is indicted by vertical lines. The metal layers are separated by a dielectric material, where a first dielectric layer 302 is provided, upon which a metal layer 304 may be formed. A dielectric layer is used to separate each of the metal layers, where a dielectric layer 306 is placed over the metal layer 304. According to the embodiment of FIG. 3, the metal layer 304 comprises a reference plane, which is a ground plane in this example.

A metal layer 308 is then applied on the dielectric layer 306. As can be seen, the metal layer 308 comprises both conductive traces for coupling input/output signals as well as a power voltage signal. After a dielectric layer 310 is applied over the conductive traces, another metal layer 312 is applied. Another dielectric layer 314 is applied over the conductive traces of the metal layer 312, upon which more conductive traces for routing power and ground signals of a metal layer 316 are provided. A dielectric layer 318 is then placed upon the conductive traces of the metal layer 316, and another ground reference plane is provided by a metal layer 320. Finally, conductive traces are provided over a dielectric layer 322, where the conductive traces of the metal layer 324 also route power and ground signals. A protective layer 326, which may be a dielectric layer, is provided over the conductive traces of the metal layer 324. Vias, such as via 327, are conductive elements implemented to couple traces in different metal layers. A substrate 328 having circuit elements, such as well regions of a transistor for example, is provided on the layers of metal traces. As will be described in more detail below in reference to FIGS. 4-6, an inductor may be implemented in a plurality of metal layers.

Figure 4:
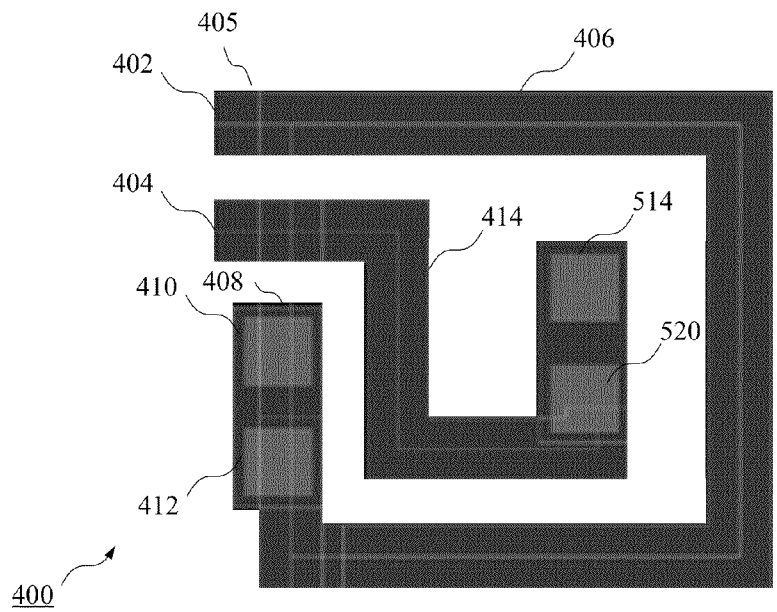
FIG. 4 is a top plan view of a first metal layer of an inductor implemented in an integrated circuit according to an embodiment.
Figure 5:
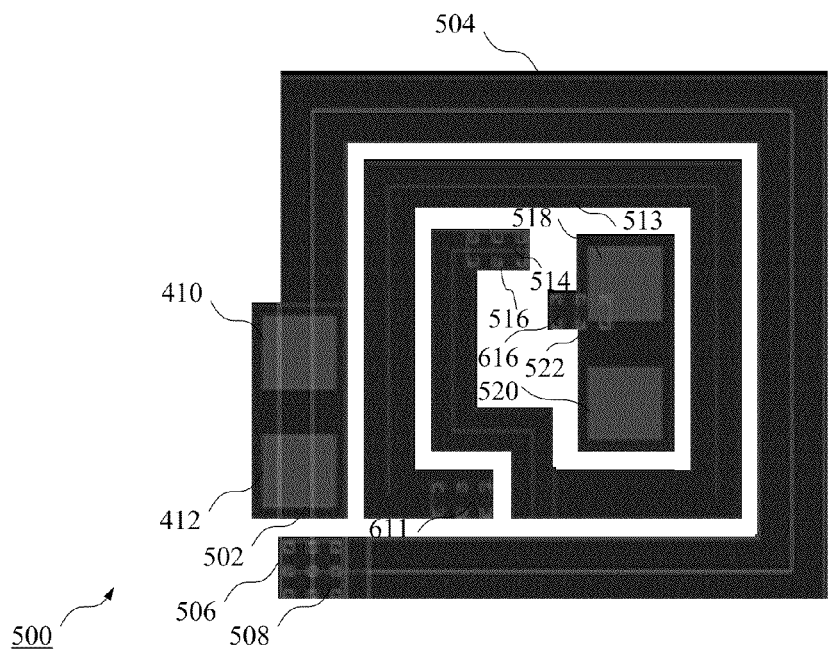
FIG. 5 is a top plan view of a second metal layer of the inductor of FIG. 4 implemented in an integrated circuit according to an embodiment.
Figure 6:
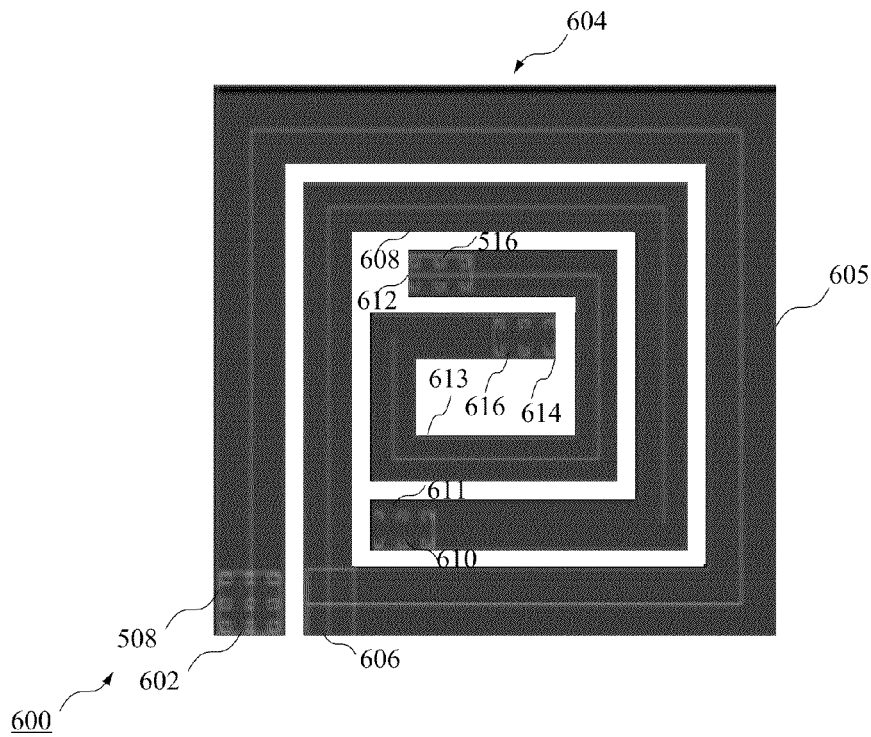
FIG. 6 is a top plan view of a third metal layer of the inductor of FIG. 4 implemented in an integrated circuit according to an embodiment.

Turning now to FIGS. 4-6, a top plan view of first through third metal layers of an inductor, such as an inductor 118, implemented in an integrated circuit are shown. Because loops of the inductor are coupled by way of vias between the metal layers, it is necessary to describe the three figures together. A first terminal 402 and a second terminal 404 of the inductor are provided on the first layer 400 as shown. The first terminal 402 is at a first end 405 of a first loop 406 of the inductor implemented between the first terminal 402 and the second terminal 404. The first loop 406 on the first layer 400 extends on four sides of a square structure, where a second end 408 is located near the first end 402. While a square structure for the loop is shown, it should be understood that the loop 406 could be some other shape, such as rectangular, circular, or any other geometric shape. While the loops of different layers may have different sizes, the loops of a given coil in each of the layers preferably have the same shape, as will be described in more detail below.

Vias 410 and 412 extend to second metal layer 500 of FIG. 5, and are electrically connected to a first end 502 of a loop 504. The loop 504 extends to a second end 506, which is also electrically connected to a via 508. As can be seen in the metal layer 600 of FIG. 6, the via 508 is coupled to a first end 602 of a loop 604 which extends approximately 720 degrees, or approximately two full loops to a second end 610. The first loop 605, which is an outer loop of the loop 604, extends to a corner 606, while the second portion of the loop 604 extends to the second end 610. It should be noted that the loops 406, 504 and 605 are approximately the same size, and are vertically aligned. Further, the loops 513 and a second loop 608, which is an inner loop of the loop 604, have the same size, and the dimensions of the loops are approximately the same. For example, if the loops have a square shape, the sides of the square are approximately equal, while circular loops have diameters which are approximately equal. Further, when the metal traces of each of the metal layers 400, 500 and 600 are formed in the integrated circuit, the loops 504 will be above and generally aligned with loop 406, and loop 605 will be above generally aligned with loop 504. While reference may be made to a layer being above or below another layer with respect to the first, second and third layers as shown, it should be understood that the layers are arranged in sequential order from the first metal layer to the third metal layer, and either the first layer or the third layer could be the top layer of a vertical stacking of the three metal layers. While an inductor in three metal layers is shown, an inductor could be formed in more layers if needed.

A via 611 at the end 610 of the loop 604 extends to a second loop 513 of metal layer 500. Loop 513 extends within the loop 504 from a first end 512 to a second end 514. A via 516 at the second end 514 extends to the first end 612 of a loop 613 in the metal layer 600. The loop 613 extends to a second end 614, where a via 616 extends to the vias 518 and 520 shown in FIGS. 4 and 5. That is, a metal trace 522 electrically couples the vias 616, 518 and 520 in metal layer 500. Finally, a metal trace 414 coupled to the vias 518 and 520 is coupled to the terminal 404.

As should be apparent, in the pictured embodiment all of the loops extend in a clockwise direction, where loops 406, 504 and 605 extend from the first layer 400 to the third layer 600 in an outer loop. Loops 406, 504, and 605 are generally the same size and shape, and are vertically aligned. Loops 608 and 513, which extend from the third layer 600 to the second layer 500 in an inner loop, are generally the same size and shape, and are also vertically aligned. A remaining inner loop 613 is positioned within the inner coil in the third layer 600.

As can be seen, loops 406, 504, and 605 are connected to form an outer coil, while loops 608 and 513 are connected to form an inner coil. The outer coil, the inner coil and the remaining loop 613 in the third layer 600 are connected to form a single coil extending from terminal 402 to terminal 404, where all of the loops, with the exception of the remaining inner loop 613 of the third layer 600, are adjacent to another loop of the same size and shape in another layer. Because the voltage through the inductor varies from the terminal 402 to the terminal 404, portions of the inductor having a minimum voltage drop are placed next to each other, thereby reducing the parasitic capacitance of the inductor.

Figure 7:
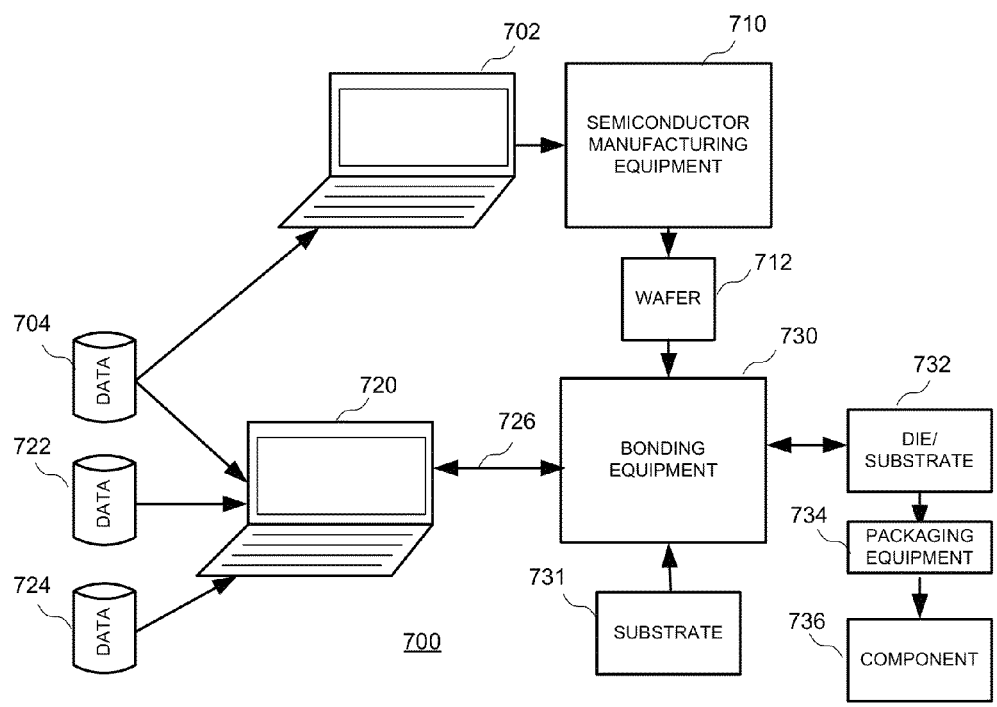
FIG. 7 is a system for producing an integrated circuit according to an embodiment.

Turning now to FIG. 7, a system for producing an integrated circuit is shown. The system 700 comprises computer aided design (CAD) equipment 702, which could be any computer adapted to run CAD software. The CAD equipment 702 receives data, such as a master pinlist 704, and is coupled by a communication link 706 to semiconductor manufacturing equipment 710. The semiconductor manufacturing equipment 710 generates a wafer 712 having a plurality of die, as is well known in the art.

CAD equipment 720, which is also coupled to receive the master pinlist 704, receives a bonding diagram 722 and substrate artwork 724. The CAD equipment 720 is coupled by a communication link 726 to bonding equipment 730. The communication links 706 and 726 could be any wired or wireless communication link. The bonding equipment generally provides wire bonds from a die from the wafer 712 to a substrate receiving the die, as will be described in more detail in reference to other figures. The die/substrate 732 is coupled to packaging equipment 734 which generates a finished component 736, such as an integrated circuit package. Although the system of FIG. 7 provides various elements required for producing an integrated circuit package, it should be understood the elements shown in FIG. 7 could be combined, or additional elements could be provided. In any configuration, the system of FIG. 7 enables generating the required traces in the metal layers to implement the circuit of FIG. 1, and particularly the loops of the inductors shown in FIGS. 4-6.

Figure 8:
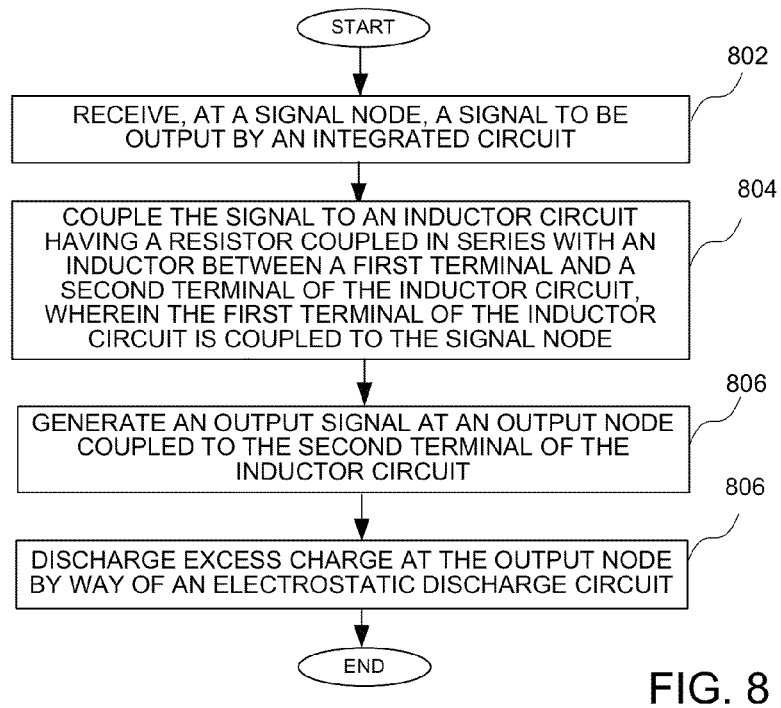
FIG. 8 is a flow chart showing a method of generating an output signal according to an embodiment.

Turning now to FIG. 8, a flow chart shows a method of generating an output signal according to an embodiment of the present invention. A signal to be output by an integrated circuit at a signal node is received at a block 802. The signal is coupled to an inductor circuit having a resistor coupled in series with an inductor between a first terminal and a second terminal of the inductor circuit, wherein the first terminal of the inductor circuit is coupled to the signal node at a block 804. An output signal is generated at an output node coupled to the second terminal of the inductor circuit at a block 806. Excess charge at the output node is discharged by way of an electrostatic discharge circuit at a block 808.

Figure 9:
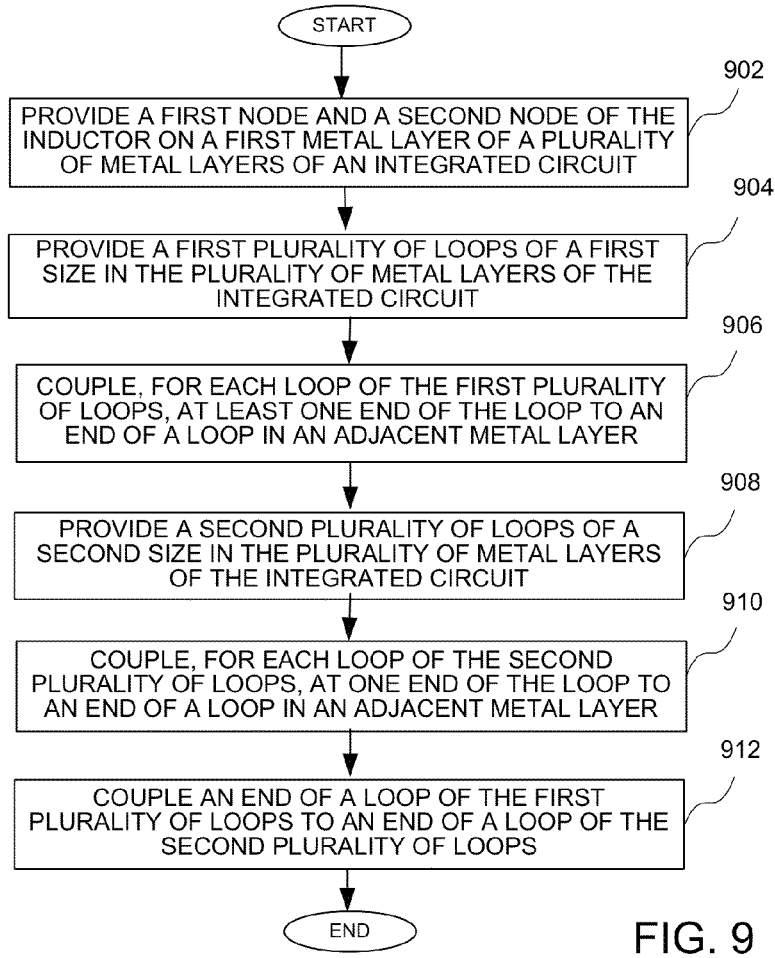
FIG. 9 is a flow chart showing a method of implementing an inductor in an integrated circuit according to an embodiment.

Turning now to FIG. 9, a flow chart shows a method of implementing an inductor in an integrated circuit according to an embodiment the present invention. A first node and a second node of the inductor are provided on a first metal layer of a plurality of metal layers of an integrated circuit at a block 902. A first plurality of loops of a first size is provided in the plurality of metal layers of the integrated circuit at a block 904. For each loop of the first plurality of loops, at least one end of the loop is coupled to an end of a loop in an adjacent metal layer at a block 906. A second plurality of loops of a second size is provided in the plurality of metal layers of the integrated circuit at a block 908. For each loop of the second plurality of loops, at least one end of the loop is coupled to an end of a loop in an adjacent metal layer at a block 910. An end of a loop of the first plurality of loops is coupled to an end of a loop of the second plurality of loops at a block 912. The methods of FIGS. 8 and 9 could be implemented using the circuits of FIGS. 1-7 as described above, or other suitable circuits.

It can therefore be appreciated that the new and novel driver circuit and method of generating an output signal has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. An inductor implemented in an integrated circuit, the inductor comprising:
    a plurality of loops of the inductor in at least a first metal layer, a second metal layer, and a third metal layer of a plurality of metal layers, the inductor extending from a first terminal in the first metal layer to a second terminal in the first metal layer; and
    a plurality of vias connecting ends of loops of the plurality of loops in different metal layers;
    wherein each loop of the first metal layer which is connected to a corresponding loop of the second metal layer overlies the corresponding loop of the second metal layer; and
    wherein the inductor comprises an outer coil having a first plurality of loops extending from the first metal layer to the third metal layer, an inner coil having a second plurality of loops extending from the third metal layer to the second metal layer, and a loop positioned within the inner coil in the third metal layer and having a first end connected to a loop of the second plurality of loops in the second metal layer and a second end connected to the second terminal in the first metal layer, the loop positioned within the inner coil in the third metal layer having a size which is smaller than a size of the loops of the second plurality of loops.

2. The inductor of claim 1, wherein the first plurality of loops is vertically aligned.

3. The inductor of claim 2, wherein the second plurality of loops is vertically aligned.

4. The inductor of claim 3, wherein the loops in the first plurality of loops have a first size which is different from the size of the loops in the second plurality of loops.

5. The inductor of claim 1, wherein the first terminal of the inductor is on a first end of a first loop on the first metal layer.

6. The inductor of claim 5, wherein a second end of the first loop is coupled to a second loop of a second metal layer by a via between the first metal layer and the second metal layer.

7. The inductor of claim 6, wherein the second metal layer is adjacent to the first metal layer.

8. An inductor implemented in an integrated circuit, the inductor comprising:
    a first plurality of loops of the inductor formed on a first corresponding plurality of metal layers and extending from a first terminal in a first metal layer to a top metal layer, the first plurality of loops coupled by first vias between the first corresponding plurality of metal layers, each loop of the first plurality of loops having a first size;
    a second plurality of loops of the inductor formed on a second corresponding plurality of metal layers and extending from the top metal layer to a second metal layer, the second plurality of loops coupled by second vias between the second corresponding plurality of metal layers, each loop of the second plurality of loops having a second size which is smaller than the first size;
    wherein the first plurality of loops is coupled to the second plurality of loops in the top metal layer; and
    a loop, positioned within a loop of the second plurality of loops in the top metal layer, having a first end coupled to a loop of the second plurality of loops in the second metal layer and a second end coupled to a second terminal in the first metal layer, and having a third size which is smaller than the second size.

9. The inductor of claim 8, wherein the loops of the first plurality of loops are vertically aligned, and the loops of the second plurality of loops are vertically aligned.

10. The inductor of claim 8, wherein the loops of the first plurality of loops are of the same shape and have approximately equal first dimensions, and the loops of the second plurality of loops are of the same shape and have approximately equal second dimensions which are different from the first dimensions.

11. The inductor of claim 8, wherein the first terminal of the inductor is on a first end of a first loop on the first metal layer.

12. The inductor of claim 11, wherein a second end of the first loop on the first metal layer is coupled to an end of a second loop on a second metal layer.

13. The inductor of claim 8, wherein the first plurality of loops, the second plurality of loops, and the loop positioned within the loop of the second plurality of loops form a single coil between the first terminal and the second terminal.

14. A method of implementing an inductor in an integrated circuit, the method comprising:
    providing a first plurality of loops of a first size in a plurality of metal layers of the integrated circuit;
    coupling, for each loop of the first plurality of loops, at least one end of the loop to an end of a loop of the first plurality of loops in an adjacent metal layer, wherein the first plurality of loops extends from a first terminal in a first metal layer to a top metal layer;
    providing a second plurality of loops of a second size, which is smaller than the first size, in the plurality of metal layers of the integrated circuit;
    coupling, for each loop of the second plurality of loops, at least one end of the loop to an end of a loop of the second plurality of loops in an adjacent metal layer, wherein the second plurality of loops extends from the top metal layer to a second metal layer;
    coupling an end of a last loop of the first plurality of loops to an end of a first loop of the second plurality of loops;
    coupling a first end of a loop of the top metal layer positioned within the second plurality of loops to a loop of the second plurality of loops in the second metal layer, wherein the loop positioned within the second plurality of loops has a third size which is smaller than the second size; and
    coupling a second end of the loop positioned within the second plurality of loops to a second terminal of the inductor in the first metal layer.

15. The method of claim 14, wherein providing a first plurality of loops comprises providing an outer coil and providing a second plurality of loops comprises providing an inner coil.

16. The method of claim 15, wherein each of the first terminal and the second terminal of the inductor is on a first metal layer.

17. The method of claim 15, wherein coupling an end of a last loop of the first plurality of loops to an end of a first loop of the second plurality of loops comprises coupling the outer coil to the inner coil.

18. The method of claim 15, wherein providing a first plurality of loops comprises providing first loops in the plurality of metal layers which are aligned, and providing a second plurality of loops comprises providing second loops in the plurality of metal layers which are aligned.

19. The method of claim 18, wherein coupling an end of a last loop of the first plurality of loops to an end of a first loop of the second plurality of loops comprises coupling the first plurality of loops and the second plurality of loops to form a single coil between the first terminal and the second terminal of the inductor.

* * * * *